(12) United States Patent
Sriram et al.

(10) Patent No.: US 10,192,980 B2
(45) Date of Patent: Jan. 29, 2019

(54) GALLIUM NITRIDE HIGH-ELECTRON MOBILITY TRANSISTORS WITH DEEP IMPLANTED P-TYPE LAYERS IN SILICON CARBIDE SUBSTRATES FOR POWER SWITCHING AND RADIO FREQUENCY APPLICATIONS AND PROCESS FOR MAKING THE SAME

(71) Applicant: Cree, Inc., Durham, NC (US)

(72) Inventors: Saptharishi Sriram, Cary, NC (US); Alexander Suvorov, Durham, NC (US); Christer Hallin, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/424,209

(22) Filed: Feb. 3, 2017

(65) Prior Publication Data

US 2017/0373178 A1    Dec. 28, 2017

Related U.S. Application Data

(63) Continuation-in-part of application No. 15/192,545, filed on Jun. 24, 2016.

(51) Int. Cl.
*H01L 29/788* (2006.01)
*H01L 29/66* (2006.01)
(Continued)

(52) U.S. Cl.
CPC ...... *H01L 29/7787* (2013.01); *H01L 29/1075* (2013.01); *H01L 29/167* (2013.01);
(Continued)

(58) Field of Classification Search
CPC ............... H01L 29/1608; H01L 29/167; H01L 29/2003; H01L 29/66068; H01L 29/66431;
(Continued)

(56) References Cited

U.S. PATENT DOCUMENTS 6,956,239 B2   10/2005   Sriram
7,812,369 B2   10/2010   Chini et al.
(Continued)

OTHER PUBLICATIONS

Shailaja P. Rao, "Implant Annealing of al dopants in silicon carbide using silane overpressure", 2005, p. 21-22, retrieved from http://scholarscommons.usf.edu/cgi/viewcontent.cgi?article=1828&context=etd on Aug. 28, 2017.

(Continued)

*Primary Examiner* — Matthew Reames
*Assistant Examiner* — John Bodnar
(74) *Attorney, Agent, or Firm* — Baker & Hostetler LLP

(57) ABSTRACT

The disclosure is directed to a high-electron mobility transistor that includes a SiC substrate layer, a GaN buffer layer arranged on the SiC substrate layer, and a p-type material layer having a length parallel to a surface of the SiC substrate layer over which the GaN buffer layer is provided. The p-type material layer is provided in one of the following: the SiC substrate layer and a first layer arranged on the SiC substrate layer. A method of making the high-electron mobility transistor is also disclosed.

20 Claims, 9 Drawing Sheets

(51) Int. Cl.
*H01L 29/16* (2006.01)
*H01L 29/20* (2006.01)
*H01L 29/167* (2006.01)
*H01L 29/423* (2006.01)
*H01L 29/778* (2006.01)
*H01L 29/10* (2006.01)
*H01L 29/40* (2006.01)

(52) U.S. Cl.
CPC ...... *H01L 29/1608* (2013.01); *H01L 29/2003* (2013.01); *H01L 29/42376* (2013.01); *H01L 29/66068* (2013.01); *H01L 29/66431* (2013.01); *H01L 29/7783* (2013.01); *H01L 29/402* (2013.01)

(58) Field of Classification Search
CPC ........... H01L 29/66462; H01L 29/7786; H01L 29/7787
See application file for complete search history.

(56) References Cited

U.S. PATENT DOCUMENTS

| | | | |
|---|---|---|---|
| 8,698,162 | B2 | 4/2014 | Lee et al. |
| 8,759,879 | B1 | 6/2014 | Tipirneni et al. |
| 9,337,332 | B2 | 5/2016 | Chu et al. |
| 2004/0099888 | A1 | 5/2004 | Sriram |
| 2004/0124435 | A1 | 7/2004 | D'Evelyn et al. |
| 2004/0149993 | A1 | 8/2004 | McClure et al. |
| 2005/0224809 | A1 | 10/2005 | Sriram |
| 2006/0125001 | A1 | 6/2006 | Sriram |
| 2007/0246713 | A1 | 10/2007 | Arnold et al. |
| 2007/0292999 | A1 | 12/2007 | Henning et al. |
| 2009/0120924 | A1 | 5/2009 | Moffatt et al. |
| 2012/0187451 | A1* | 7/2012 | Saito ................... H01L 29/0623 257/192 |
| 2012/0217511 | A1 | 8/2012 | Renaud et al. |
| 2013/0049014 | A1* | 2/2013 | Aigo ....................... C30B 25/02 257/77 |
| 2013/0153967 | A1 | 6/2013 | Curatola et al. |
| 2013/0221320 | A1 | 8/2013 | Li et al. |
| 2014/0117381 | A1 | 5/2014 | Kang et al. |
| 2014/0253241 | A1 | 9/2014 | Lee et al. |
| 2015/0028345 | A1* | 1/2015 | Wong .................. H01L 29/7787 257/76 |
| 2015/0236146 | A1* | 8/2015 | Liu ................... H01L 29/66462 257/76 |
| 2016/0035870 | A1 | 2/2016 | Wu et al. |
| 2016/0071967 | A1 | 3/2016 | Prechtl et al. |
| 2017/0018638 | A1 | 1/2017 | Teo et al. |

OTHER PUBLICATIONS

Wendt et al., FIB Milling and Canneling, Nov. 1, 2008, p. 1, Figure 1; Retrieved from http://www.imaging-git.com/science/scanning-probe-microscopy/fib-milling-and-canneling on Aug. 28, 2017.

International Search Report and Written Opinion dated Sep. 21, 2007 for PCT/US2017/38937, filed Jun. 23, 2017.

"Fabrication and Characterization of Heterojunction Diodes with HVPE-Grown GaN on 4H—SiC", Erik Danielsson, Carl-Mikael Zetterling, Mikael Ostling, Andrey Nikolaev, Irina P. Nikitina, and Vladimir Dmitriev. IEEE Transactions on Electron Devices, vol. 48, No .3, Mar. 2001.

Office Action issued in U.S. Appl. No. 15/192,545, dated Apr. 12, 2018.

* cited by examiner

GALLIUM NITRIDE HIGH-ELECTRON MOBILITY TRANSISTORS WITH DEEP IMPLANTED P-TYPE LAYERS IN SILICON CARBIDE SUBSTRATES FOR POWER SWITCHING AND RADIO FREQUENCY APPLICATIONS AND PROCESS FOR MAKING THE SAME

CROSS REFERENCE TO PRIOR APPLICATIONS

This application is a continuation in part of the U.S. patent application Ser. No. 15/192,545, filed Aug. 15, 2016, which is incorporated herein by reference in its entirety.

FIELD OF THE DISCLOSURE

The disclosure relates to microelectronic devices and more particularly to gallium nitride high-electron mobility transistors with p-type layers. The disclosure also relates to a process of making microelectronic devices and more particularly to a process of making gallium nitride high-electron mobility transistors with p-type layers.

BACKGROUND OF THE DISCLOSURE

Gallium Nitride (GaN) based high-electron mobility transistors (HEMTs) are very promising candidates for high power radiofrequency (RF) applications, and also for low frequency high power switching applications since the material properties of GaN enable achievement of high voltage and high current. However, an important issue in these devices is the design of the buffer layer to achieve high voltage capability. Many designs currently use deep level impurities such as iron (Fe) or carbon (C) to minimize current flow through the buffer layer at high drain voltage conditions. However, both Fe and C lead to drain lag effect, which is the slow recovery of drain current when the drain voltage is changed from a high value to a lower one. This is very undesirable for both power and RF applications since it leads to lower switching current, lower efficiency, and other problems. The drain lag effect may be eliminated by using high purity buffer layers without Fe or C. However, these devices have high leakage current through the buffer layer which is also not acceptable.

Accordingly, there is a need for an alternative solution to addressing lag effect in GaN HEMTs.

SUMMARY OF THE DISCLOSURE

According to an aspect of this disclosure a high-electron mobility transistor includes a SiC substrate layer, a GaN buffer layer arranged on the SiC substrate layer, and a p-type material layer having a length parallel to a surface of the SiC substrate layer over which the GaN buffer layer is provided, where the p-type material layer is provided in one of the following: the SiC substrate layer and a first layer arranged on the SiC substrate layer.

According to another aspect of this disclosure a method of making a high-electron mobility transistor includes providing a SiC substrate layer, providing a GaN buffer layer on the SiC substrate layer, providing a p-type material layer having a length parallel to a surface of the SiC substrate layer over which the GaN buffer layer is provided, and providing the p-type material layer in one of the following: the SiC substrate layer and a first layer arranged on the SiC substrate layer.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
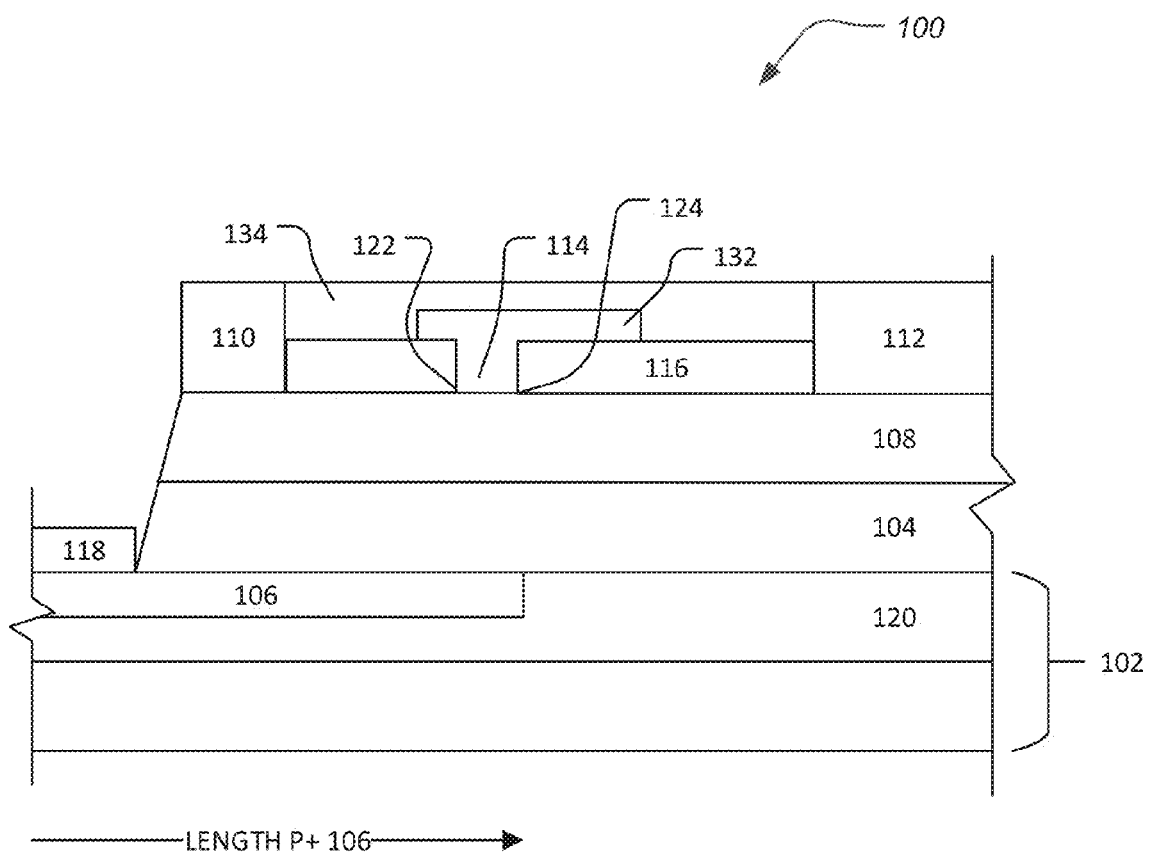
FIG. 1 shows a cross-sectional view of one aspect of a transistor according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition to the type of structure, the characteristics of the semiconductor material from which a transistor is formed may also affect operating parameters. Of the characteristics that affect a transistor's operating parameters, the electron mobility, saturated electron drift velocity, electric breakdown field and thermal conductivity may have an effect on a transistor's high frequency and high power characteristics.

Electron mobility is the measurement of how rapidly an electron is accelerated to its saturated velocity in the presence of an electric field. In the past, semiconductor materials which had a high electron mobility were preferred because more current could be developed with a lesser field, resulting in faster response times when a field is applied. Saturated electron drift velocity is the maximum velocity that an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields generally can be supported by a given dimension of material. Larger electric fields allow for faster transients as the electrons can be accelerated more quickly by larger electric fields than by smaller ones.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

The disclosure includes both extrinsic and intrinsic semiconductors. Intrinsic semiconductors are undoped (pure). Extrinsic semiconductors are doped, meaning an agent has been introduced to change the electron and hole carrier concentration of the semiconductor at thermal equilibrium. Both p-type and n-type semiconductors are disclosed, with p-types having a larger hole concentration than electron concentration, and n-types having a larger electron concentration than hole concentration.

Silicon carbide (SiC) has excellent physical and electronic properties which should theoretically allow production of electronic devices that can operate at higher temperatures, higher power, and higher frequency than devices produced from silicon (Si) or gallium arsenide (GaAs). The high electric breakdown field of about 4×E6 V/cm, high saturated electron drift velocity of about 2.0×E7 cm/sec and high thermal conductivity of about 4.9 W/cm-° K indicate that SiC would be suitable for high frequency and high power applications.

The drain lag in the disclosed GaN HEMTs is in some aspects addressed with the addition of structures. In these structures, a p-type layer is used to simultaneously achieve high breakdown, and no drain lag. The p-type layer helps in optimizing the breakdown voltage and can be charged and discharged easily which ensures absence of drain lag. In one aspect, the p-type layer is formed in a SiC substrate.

This approach overcomes two problems: 1. It is difficult to form p-type layers in GaN using ion-implantation. Selective ion-implantation enables optimization of the device structure by allowing different concentrations to be obtained in different regions. This can be more difficult with epitaxial growth. 2. P-type doping of GaN using magnesium (Mg) also exhibits memory effects which precludes the formation of abrupt interfaces.

The disclosed process and structure may enable development of GaN HEMTs with high voltage capability suitable for power switching without the adverse drain lag effects. The disclosed process and structure may also lead to more compact device structures (due to optimized field shaping)

that will lower costs. Additionally, with proper design, the disclosed structures can also be applied to high power RF devices for the telecommunication and other applications. An important advantage is the minimization of device memory effects, which is a serious problem for telecommunication applications.

Figure 2:
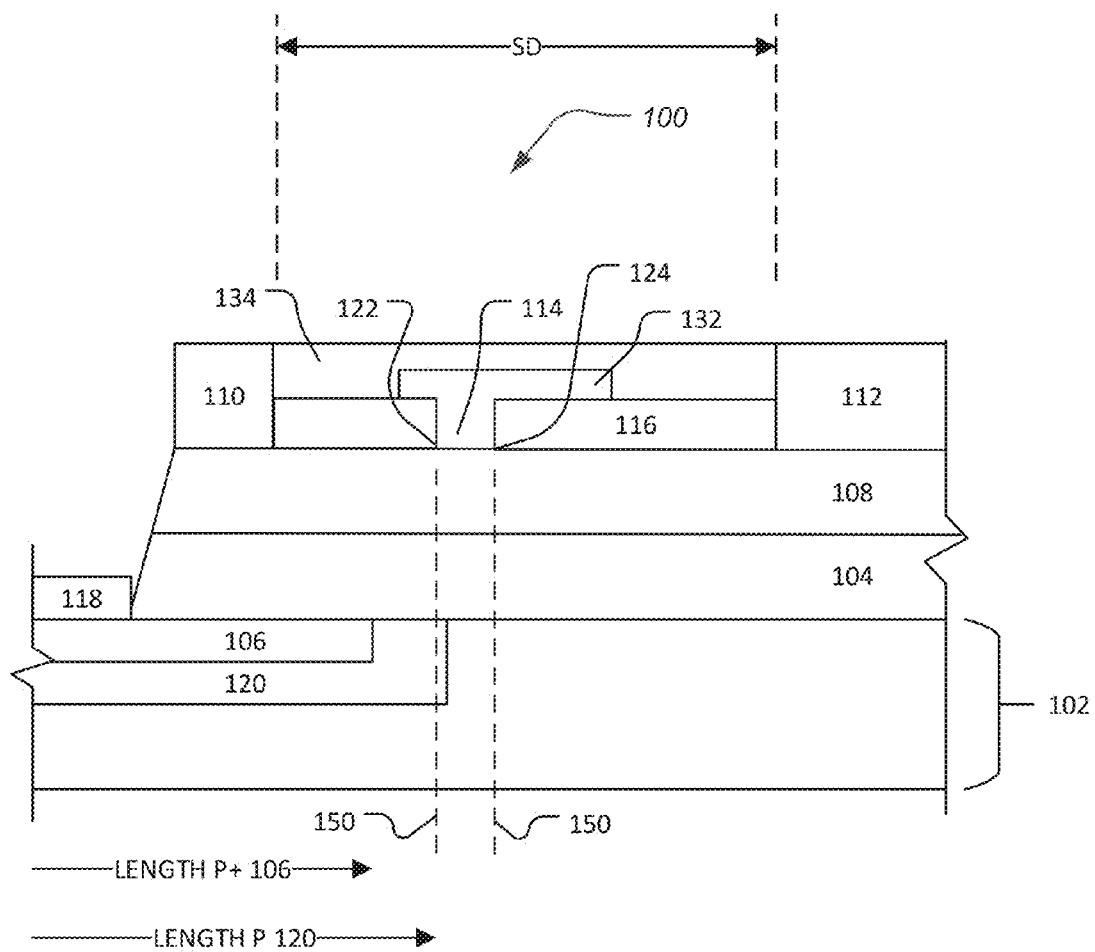
FIG. 2 shows a cross-sectional view of another aspect of a transistor according to the disclosure.

FIG. 1 shows a cross-sectional view of one aspect of a transistor according to the disclosure; and FIG. 2 shows a cross-sectional view of another aspect of a transistor according to the disclosure. In particular, FIG. 1 shows a cross-sectional view of a transistor 100. The transistor 100 may include a substrate layer 102. The substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be $1E15/cm^3$ or less. The substrate layer 102 may be formed of SiC selected from the group of 6H, 4H, 15R 3C SiC, or the like.

In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials.

The substrate layer 102 may include a p-type material layer 120. The p-type material layer 120 may be formed by ion implantation of aluminum (Al) and annealing. In other aspects, the p-type material layer 120 may be formed by ion implantation of boron, gallium, or any other material that may form a p-type layer. In one aspect the p-type material layer 120 may be formed by implantation and annealing of Al prior to the growth of any GaN layers. In one aspect, the ion implementation may utilize channeling implants. In one aspect, the channeling implants may include aligning the ion beam to the substrate layer 102. Alignment of the ion beam may result in increased implanting efficiency.

Aspects of the disclosure are based on a realization that implant channeling can be used to controllably form implanted regions in silicon carbide that are highly uniform by depth using lower energy implants which result in reduced lattice damage. Channeling is experienced when ions are implanted along a crystal axis of a semiconductor. When a direction of implantation is close to a major axis of the crystal lattice, the atoms in the crystal lattice appear to "line up" relative to the direction of implantation, and the implanted ions appear to travel down the channels created by then crystal structure. This reduces the likelihood of collisions between the implanted ions and the atoms in the crystal lattice, especially near the surface of the semiconductor layer. As a result, the depth of the implant is greatly increased.

In general, channeling occurs in silicon carbide when the direction of implantation is within about 2° of a crystallographic axis of the silicon carbide crystal. When the direction of implantation is more than about 2° of a crystallographic axis of the silicon carbide crystal, the atoms in the lattice appear to be randomly distributed relative to the direction of implantation, which reduces channeling effects. As used herein, the term "implant angle" refers to the angle between the direction of implantation and a crystallographic axis, such as the c-axis or <0001> axis, of the semiconductor layer into which ions are implanted. Thus, an implant angle of less than about 2° relative to the c-axis of a silicon carbide layer is expected to result in channeling. However, other implant angles may be utilized as well.

In one aspect, the p-type material layer 120 may be formed by ion implantation of $^{27}Al$ in 4H—SiC implanted with channeling conditions with an implant energy of $E_1=100$ keV with a dose of $1E13\ cm^2$ at 25° C. In one aspect, the p-type material layer 120 may be formed by ion implantation of $^{27}Al$ in 4H—SiC implanted with channeling conditions with an implant energy of $E_2=300$ keV with a dose of $1E13\ cm^2$ at 25° C. However, other implant energies and doses are contemplated as well. For example, in some aspects the implant energy may be 20 keV to 80 keV, 80 keV to 120 keV, 120 keV to 160 keV, 160 keV to 200 keV, 200 keV to 240 keV, 240 keV to 280 keV, 280 keV to 340 keV, 340 keV to 400 keV, 20 keV to 400 keV, and/or 80 keV to 340 keV; and in some aspects the implant dose may be $0.6E13\ cm^2$ to $0.8E13\ cm^2$, $0.8E13\ cm^2$ to $1.2E13\ cm^2$, $1.2E13\ cm^2$ to $1.6E13\ cm^2$, $1.6E13\ cm^2$ to $2E13\ cm^2$, $0.6E13\ cm^2$ to $2E13\ cm^2$, and/or $0.8E13\ cm^2$ to $1.2E13\ cm^2$. Additionally, it should be noted that the p-type material layer 120 may be formed by implantation of other materials such as Boron (B), Gallium (Ga) and/or the like, followed by a high temperature anneal.

In one aspect the ion implantation may result in the p-type material layer 120 being a deep layer. In one aspect the ion implantation may result in the p-type material layer 120 having a thickness of 1 μm or less. In one aspect the ion implantation may result in the p-type material layer 120 having a thickness of 0.7 μm or less. In one aspect the ion implantation may result in the p-type material layer 120 having a thickness of 0.5 μm or less. In one aspect the ion implantation may result in the p-type material layer 120 having a thickness of 0.3 μm to 0.5 μm. In one aspect the ion implantation may result in the p-type material layer 120 having a thickness of 0.2 μm to 0.6 μm. In one aspect the ion implantation may result in the p-type material layer 120 having a thickness of 0.4 μm to 0.6 μm. In one aspect the ion implantation may result in the p-type material layer 120 having a thickness of 0.6 μm to 0.8 μm. In one aspect the ion implantation may result in the p-type material layer 120 having a thickness of 0.6 μm to 1.6 μm. In one aspect the ion implantation may result in the p-type material layer 120 having a thickness of 0.6 μm to 2.1 μm. In one aspect the ion implantation may result in the p-type material layer 120 having a thickness of 1 μm to 5 μm. In one aspect, the p-type material layer 120 implantation and/or doping may be in the range of 5E15 to 5E17 per $cm^3$ and extend to depths up to 5 μm. In one aspect the ion implantation may result in the p-type material layer 120 having a thickness of 10% to 20% of a thickness of the substrate 102. In one aspect the ion implantation may result in the p-type material layer 120 having a thickness of 20% to 30% of a thickness of the substrate 102. In one aspect the ion implantation may result in the p-type material layer 120 having a thickness of 30% to 40% of a thickness of the substrate 102. In one aspect the ion implantation may result in the p-type material layer 120 having a thickness of 40% to 50% of a thickness of the substrate 102. In one aspect the ion implantation may result in the p-type material layer 120 having a thickness of 50% to 60% of a thickness of the substrate 102. In one aspect the ion implantation may result in the p-type material layer 120 having a thickness of 60% to 70% of a thickness of the substrate 102. In one aspect the ion implantation may result in the p-type material layer 120 having a thickness of 70% to 80% of a thickness of the substrate 102. In one aspect the ion implantation may result in the p-type material layer 120 having a thickness of 80% to 90% of a thickness of the substrate 102.

The p-type material layer 120 may be implanted within the substrate layer 102 and subsequently annealed. Annealing may allow for the implantation to be activated. In one aspect, a masking layer material may be utilized during implantation. In some aspects, during annealing of the p-type material layer 120, a cap layer material may be used to cover the wafer surface to prevent dissociation of the substrate at high temperatures. Once the p-type material layer 120 has been formed, the masking layer material may be removed. Annealing may be performed at a temperature range of 1500-1850° C. for 5 minutes-30 minutes. Other annealing time and temperature profiles are contemplated as well.

In some aspects, the substrate layer 102 may be made of a p-type material SiC substrate. In this aspect, the p-type material layer 120 formation by implantation may not be necessary. Further in this aspect, the substrate layer 102 being a p-type material SiC substrate may be subsequently subjected to the processes as described herein including implantation of a p+ layer 106.

Figure 3:
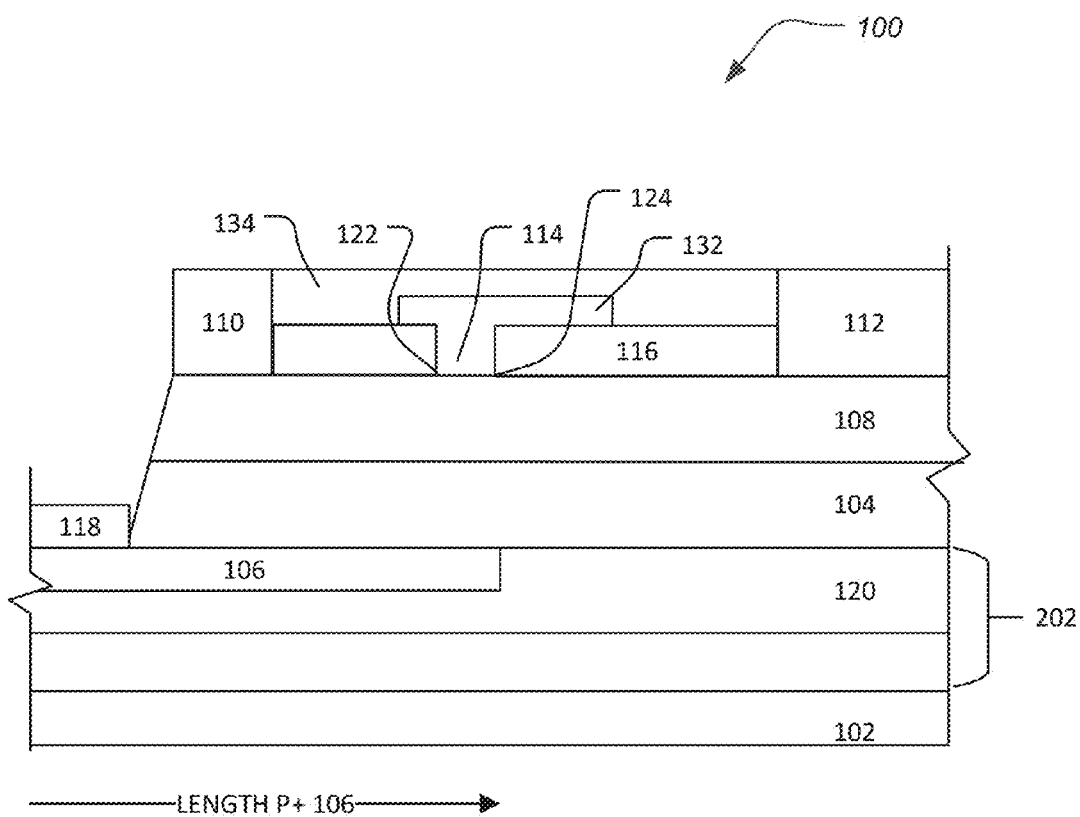
FIG. 3 shows a cross-sectional view of another aspect of a transistor according to the disclosure.
Figure 4:
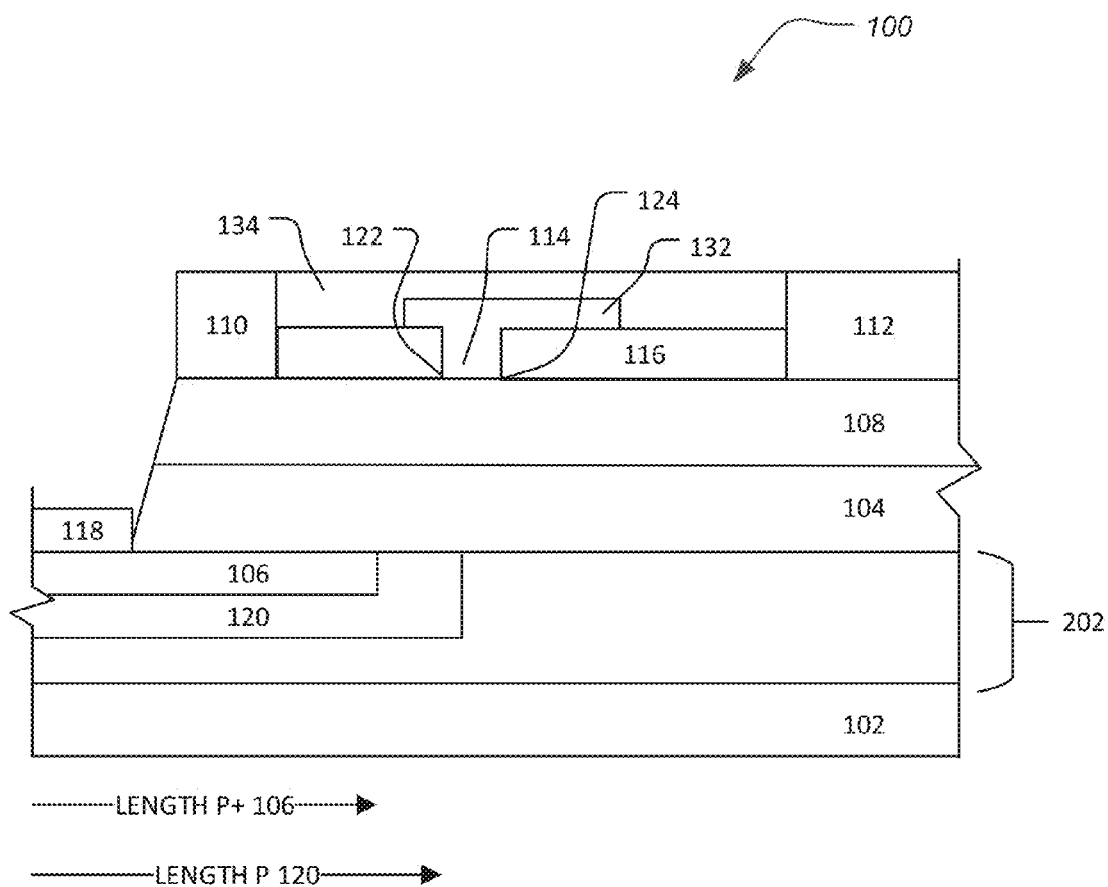
FIG. 4 shows a cross-sectional view of another aspect of a transistor according to the disclosure.

FIG. 3 shows a cross-sectional view of another aspect of a transistor according to the disclosure; and FIG. 4 shows a cross-sectional view of another aspect of a transistor according to the disclosure. As shown in FIG. 3 and FIG. 4, an epitaxial layer 202 may be formed on the substrate layer 102. In the aspects of FIG. 3 and FIG. 4, the p-type material layer 120 may be in the epitaxial layer 202. In some aspects, the p-type material layer 120 may be in the epitaxial layer 202 in certain aspects where the substrate layer 102 includes GaAs, GaN, or the like substrate materials. In one aspect, the epitaxial layer 202 is formed of SiC.

In one aspect, the epitaxial layer 202 may be arranged on top of the substrate layer 102. In one aspect, the epitaxial layer 202 may be arranged directly on top of the substrate layer 102. Thereafter, the p-type material layer 120 may be implanted within the epitaxial layer 202 and subsequently annealed as described herein. Further in this aspect, the epitaxial layer 202 may be subsequently subjected to processes as described herein including implantation of a p+ layer 106. In one aspect the ion implantation may result in the p-type material layer 120 having a thickness of 10% to 20% of a thickness of the epitaxial layer 202. In one aspect the ion implantation may result in the p-type material layer 120 having a thickness of 20% to 30% of a thickness of the epitaxial layer 202. In one aspect the ion implantation may result in the p-type material layer 120 having a thickness of 30% to 40% of a thickness of the epitaxial layer 202. In one aspect the ion implantation may result in the p-type material layer 120 having a thickness of 40% to 50% of a thickness of the epitaxial layer 202. In one aspect the ion implantation may result in the p-type material layer 120 having a thickness of 50% to 60% of a thickness of the epitaxial layer 202. In one aspect the ion implantation may result in the p-type material layer 120 having a thickness of 60% to 70% of a thickness of the epitaxial layer 202. In one aspect the ion implantation may result in the p-type material layer 120 having a thickness of 70% to 80% of a thickness of the epitaxial layer 202. In one aspect the ion implantation may result in the p-type material layer 120 having a thickness of 80% to 90% of a thickness of the epitaxial layer 202.

In another aspect, the epitaxial layer 202 may utilize a p-type material and the epitaxial layer 202 may be arranged on top of the substrate layer 102. In another aspect, the epitaxial layer 202 may utilize a p-type material and the epitaxial layer 202 may be arranged directly on top of the substrate layer 102. In this regard, in certain aspects, a p-type material epitaxial layer 202 may be grown that results in an epitaxial layer 202 having the p-type material layer 120 and may not require implantation as described herein to form the p-type material layer 120. Thereafter, the epitaxial layer 202 may be subsequently subjected to the processes including implantation of a p+ layer 106 as described in further detail below. In some aspects, the epitaxial layer 202 may be formed by epitaxial growth utilizing off-axis oriented wafers.

Figure 5:
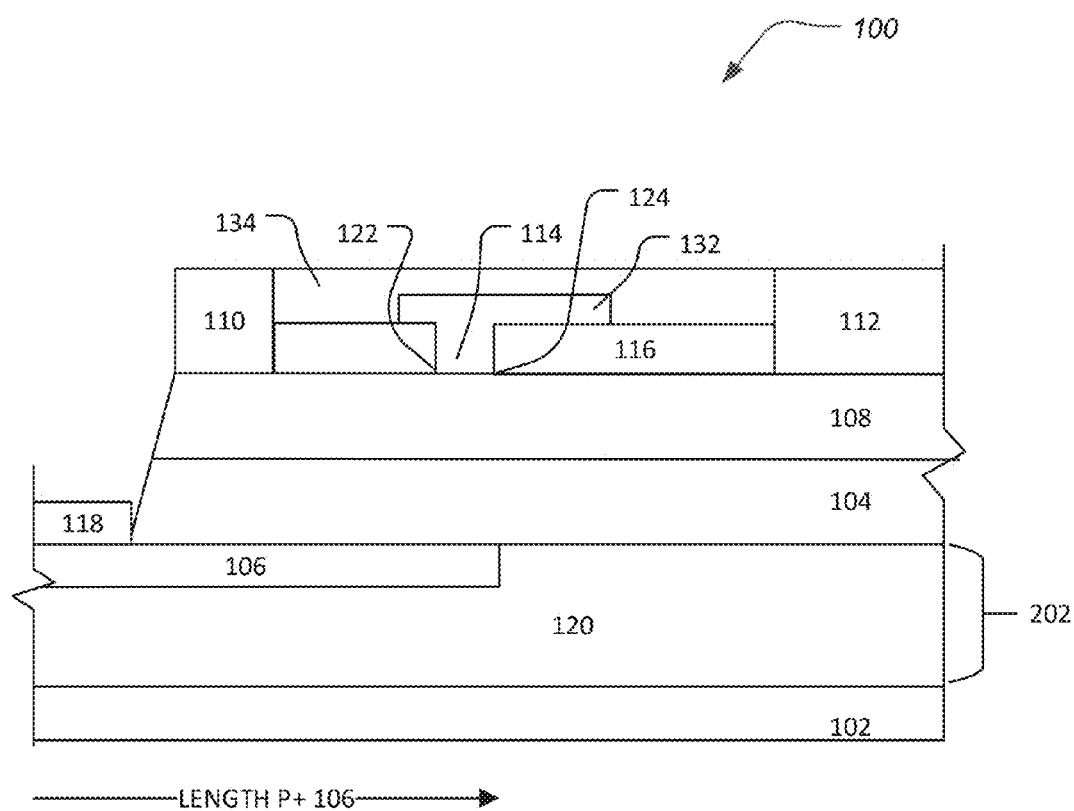
FIG. 5 shows a cross-sectional view of another aspect of a transistor according to the disclosure.

FIG. 5 shows a cross-sectional view of another aspect of a transistor according to the disclosure. In the FIG. 5 aspect, the epitaxial layer 202 may formed with a p-type material and the epitaxial layer 202 may be arranged directly on top of the substrate layer 102. In this aspect, the entire epitaxial layer 202 may form the p-type material layer 120. Thereafter, the epitaxial layer 202 may be subsequently subjected to the processes including implantation of a p+ layer 106 as described in further detail below.

In some aspects, the p-type material layer 120 may also be configured to have a varying doping and/or implantation profile perpendicular to the surface. In some aspects, the p-type material layer 120 may also be configured to have a varying profile perpendicular to the surface extending into the cross-sectional views of FIGS. 1-7. The profile may be optimized to achieve desired breakdown voltage, device size, and switching time.

In one aspect, the p-type material layer 120 may be present uniformly under the transistor 100 for certain applications as shown in FIG. 1 and FIG. 3. In one aspect, the p-type material layer 120 may be present uniformly under the transistor 100 for power switching applications as shown in FIG. 1 and FIG. 3.

In another aspect for certain applications, such as RF applications, the p-type material layer 120 may be located in limited areas such as in part of the gate-source region of the transistor 100 as illustrated in FIG. 2 and FIG. 4 and described in further detail below.

In some aspects, part of the voltage from a drain 112 to a source 110 may be dropped in the p-type material layer 120 region. This may also deplete the channel in the lateral direction. The lateral depletion may reduce the lateral field and increase breakdown voltage. Alternatively, a more compact structure can be obtained for a required breakdown voltage. The p-type material layer 120 may eliminate the need to have C or Fe doping of the buffer needed to sustain the applied drain voltage. Elimination of C and Fe deep levels leads to decreased current reduction under operating conditions (no trapping). Moreover, in some aspects the p-type material layer 120 supports the field.

In some aspects, the substrate layer 102 may include a p+ layer 106 as shown in FIG. 1 and FIG. 2. In some aspects, the epitaxial layer 202 may include a p+ layer 106 as shown in FIG. 3 and FIG. 4. The p+ layer 106 may be used to reduce charging time constants and to achieve contact formation. In some aspects, the p+ layer 106 may also be formed by ion-implantation and annealing. The p+ layer 106 may be doped as highly as possible with minimum achievable sheet resistance. In some aspects, the p+ layer 106 may be present in a gate-source region. In some aspects, the p+ layer 106 may be present in a gate-source region and also partly under the gate. In some aspects, the p+ layer 106 may be present in limited areas as described in further detail below. In some aspects, the p+ layer 106 may be under 0.3 µm in thickness. In some aspects, the p+ layer 106 may be under 0.2 µm in thickness. In some aspects, the p+ layer 106 may be between 0.1 and 0.3 µm in thickness. In some aspects, the p+ layer 106 may be between 0.05 and 0.25 µm in thickness. In some aspects, the p+ layer 106 may be between 0.15 and 0.25 µm in thickness.

On the substrate layer 102, a buffer layer 104, or nucleation layer, may be formed. In one aspect, the buffer layer 104 is formed directly on the substrate layer 102. In one aspect, the epitaxial layer 202 may be arranged on top of the substrate layer 102 and the buffer layer 104 may be formed on the epitaxial layer 202. In one aspect, the epitaxial layer 202 may be arranged on top of the substrate layer 102 and the buffer layer 104 may be formed directly on the epitaxial layer 202. The buffer layer 104 may be GaN, Aluminum Gallium Nitride (AlGaN), Aluminum Nitride (AlN), or another suitable material and may also include a nucleation layer of AlN. In one aspect, the buffer layer 104 is formed of AlGaN. The buffer layer 104 may be a p-type material, or alternatively can be undoped. An AlN nucleation layer may be used to adhere to the substrate layer 102 and may help grow the buffer layer 104. The buffer layer 104 may bind to the substrate layer 102.

In one aspect, the buffer layer 104 may be high purity GaN. In one aspect, the buffer layer 104 may be high purity GaN that may be a low-doped n-type. In one aspect, the buffer layer 104 may also use AlGaN back barrier to achieve better electron confinement.

Figure 6:
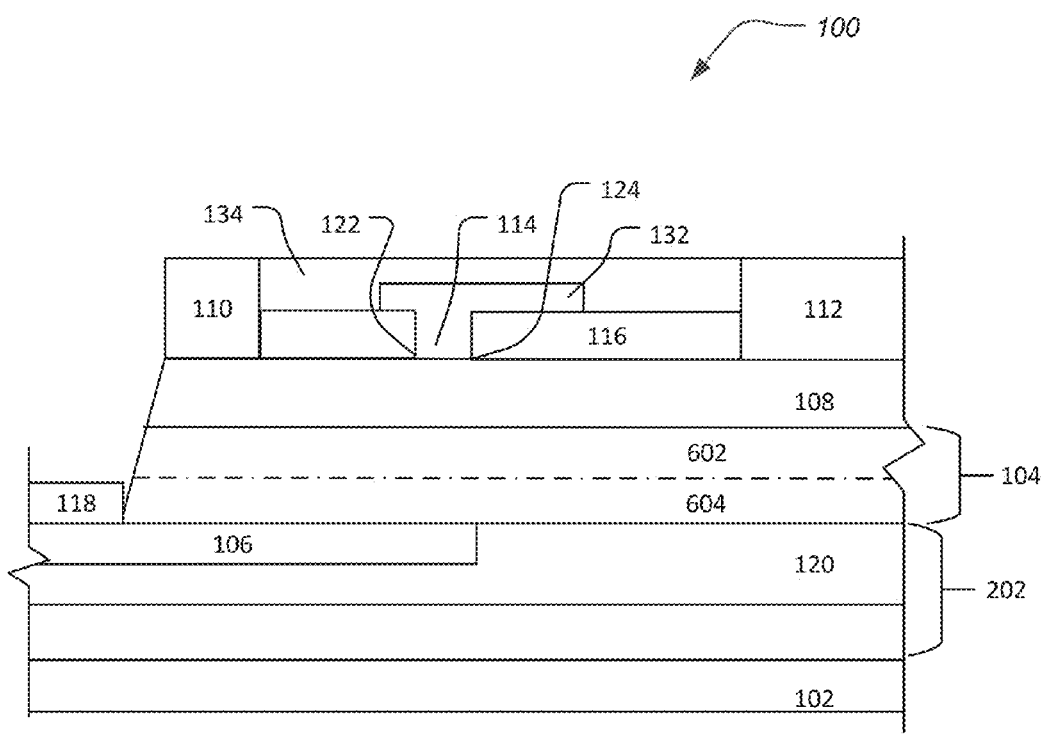
FIG. 6 shows a cross-sectional view of another aspect of a transistor according to the disclosure.

FIG. 6 shows a cross-sectional view of another aspect of a transistor according to the disclosure. In particular, the FIG. 6 aspect illustrates that the buffer layer 104 may include an upper portion 602 of high purity GaN and the buffer layer 104 may also include a lower portion 604 that may form an AlGaN back barrier to achieve better electron confinement. In one aspect, the lower portion 604 that forms the back barrier may be AlGaN of n type. The back barrier construction may be implemented in any of the aspects of the disclosure.

In one aspect, the buffer layer 104 may be designed to be of the high purity type where the Fermi level is in the upper half of the bandgap, which minimizes slow trapping effects normally observed in GaN HEMTs. In this regard, the traps under the Fermi level are filled always and thus slow transients may be prevented. In some aspects, the buffer layer 104 may be as thin as possible consistent with achieving good crystalline quality. Applicants have already demonstrated 0.4 µm layers with good quality.

In some aspects, a $Al_zGa_{1-z}N$ ($0<=z<=1$) nucleation layer or buffer layer 104 may be grown on the substrate layer 102 via an epitaxial crystal growth method, such as MOCVD (Metalorganic Chemical Vapor Deposition), HVPE (Hydride Vapor Phase Epitaxy) or MBE (Molecular Beam Epitaxy). The formation of the nucleation layer may depend on the material of the substrate layer 102.

In another aspect, the buffer layer 104 may be formed with Lateral Epitaxial Overgrowth (LEO). LEO can, for example, improve the crystalline quality of GaN layers. When semiconductor layers of a HEMT are epitaxial, the layer upon which each epitaxial layer is grown may affect the characteristics of the device. For example, LEO may reduce dislocation density in epitaxial GaN layers.

On the buffer layer 104, a barrier layer 108 may be formed. In one aspect, the barrier layer 108 may be formed directly on the buffer layer 104. The barrier layer 108 may provide an additional layer between the buffer layer 104 and a source 110, a drain 112, and a gate 114. The barrier layer 108 may be AlGaN, AlN, or another suitable material. In one aspect, the barrier layer 108 is AlGaN. In one aspect, the barrier layer 108 may be undoped. In one aspect the barrier layer 108 may be an n-type material. In some aspects, the barrier layer 108 may have multiple layers of n-type material having different carrier concentrations. In one aspect the barrier layer 108 may be a Group III-nitride or a combination thereof.

To protect and separate the gate 114 and the drain 112, a protective layer 116 may be arranged on the barrier layer 108, on a side opposite the buffer layer 104, adjacent the gate 114 and drain 112. The protective layer 116 may be a passivation layer made of SiN, AlO, SiO, $SiO_2$, AlN, or the like, or a combination incorporating multiple layers thereof. In one aspect, the protective layer 116 is a passivation layer made of SiN. In one aspect the protective layer 116 can be deposited using MOCVD, plasma chemical vapor deposition (CVD), hot-filament CVD, or sputtering. In one aspect, the protective layer 116 may include deposition of $Si_3N_4$. In one aspect, the protective layer 116 forms an insulating layer. In one aspect, the protective layer 116 forms an insulator.

The source 110 may have a p-type material contact 118 on the p+ layer 106. The p-type material contact 118 may be formed on the p+ layer 106 in a recess provided in the buffer layer 104 and the barrier layer 108. The p-type material contact 118 may be electrically coupled to the p+ layer 106. The recess may extend down to the p+ layer 106 to allow for the p-type material contact 118 to be created there. The recess may be formed by etching, and may also use a material to define the recess. The material may be removed after the recess has been created.

In some aspects, implantation of the p-type material layer 120 may expand the entire length of the transistor 100 as shown in FIG. 1 and FIG. 3. In some aspects, implantation of the p-type material layer 120 may partially extend the length of the transistor 100 as shown in FIG. 2 and FIG. 4.

In some aspects, the p-type material layer 120 may be neutralized to limit the length of the p-type material layer 120. In one aspect, neutralizing may include implantation of impurities. In one aspect, neutralizing the p-type material layer 120 may include absorbing the charge of the p-type material layer 120 with a material of opposite polarity. Another way to limit the length of the p-type material layer 120 may be to etch the p-type material layer 120. Another way to limit the length of the p-type material layer 120 may be to use a masking material to limit the area for implantation.

In another aspect, the p-type material layer 120 may be formed by growing the p-type material layer 120. Growth may be epitaxial, for example. To limit the length of the p-type material layer 120, the p-type material layer 120 may be etched or otherwise neutralized.

The p-type material layer 120 may help avoid breakdowns and problems with material impurities. For example, without a p-type material layer 120, the transistor 100 may need impurities which do not discharge well. The p-type material layer 120 may be formed beneath the source 110, and may extend toward the gate 114 of the device.

In one aspect, the p-type material layer 120 may extend the entire length and remain as shown in FIGS. 1 and 3. In one aspect, the p-type material layer 120 may generally extend the entire length and remain as shown in FIGS. 1 and 3. In one aspect, the p-type material layer 120 may substantially extend the entire length and remain as shown in FIGS. 1 and 3.

In another aspect of the disclosure, the p-type material layer 120 may not extend over the entire area of the transistor 100 as shown by the arrow LENGTH P 120 as shown in FIGS. 2 and 4. In this regard, the p-type material layer 120 may be selectively arranged as described in detail below, the p-type material layer 120 may be arranged over the entire length and selectively removed as described in detail below, the p-type material layer 120 may be arranged over the entire length and selectively electrically neutralized as described in detail below, or the like. Accordingly, the specific constructions of the p-type material layer 120 described below encompass any of these processes that result in the p-type material layer 120 having an operating construction and arrangement as noted below. In other words, the length and/or size of the p-type material layer 120 does not include a part that is partially electrically neutralized, partially etched, or the like. The length and/or size of the p-type material layer 120 may depend on the application of the transistor 100, requirements for the transistor 100, and the like. Limiting the p-type material layer 120 so that it does not extend beyond the gate 114 avoids adverse effects on RF performance for certain transistor applications.

With reference to the aspects further described below, the p-type material layer 120 may extend horizontally parallel to the arrow LENGTH P 120. Moreover, the p-type material layer 120 may extend horizontally parallel to the arrow LENGTH P 120 to a point defined by a line that is perpendicular to the arrow LENGTH P 120 and extends through a component of the transistor 100 as illustrated by lines 150.

In one aspect of the disclosure, the p-type material layer 120 may extend laterally from at least beneath the source 110 toward a first edge 124 of the gate 114. In one aspect of the disclosure, the p-type material layer 120 may extend laterally from at least beneath the source 110 to a position beneath a first edge 124 of the gate 114.

In certain aspects of the disclosure, the p-type material layer 120 may extend horizontally to a point within about 0 to about 0.7 µm of the first edge 124 of the gate 114. In certain aspects of the disclosure, the p-type material layer 120 may extend horizontally to a point within about 0 to about 0.5 µm of the first edge 124 of the gate 114. In certain aspects of the disclosure, the p-type material layer 120 may extend horizontally to a point within about 0 to about 0.3 µm of the first edge 124 of the gate 114. In one aspect of the disclosure, the p-type material layer 120 may extend horizontally from at least beneath the source 110 to a position beneath a second edge 122 of the gate 114. In certain aspects of the disclosure, the p-type material layer 120 may extend horizontally to a point within about 0 to about 0.7 µm of the second edge 122 of the gate 114. In certain aspects of the disclosure, the p-type material layer 120 may extend horizontally to a point within about 0 to about 0.5 µm of the second edge 122 of the gate 114. In certain aspects of the disclosure, the p-type material layer 120 may extend horizontally to a point within about 0 to about 0.3 µm of the second edge 122 of the gate 114.

In other aspects, a length of the p-type material layer 120 LENGTH P 120 can be seen in relation to positions and/or lengths of other components. A length SD may be the length between an inner edge 142 of the source 110 and an inner edge 144 of the drain 112 as shown in FIG. 2.

In one aspect, the length of the p-type material layer 120 may extend from 10% to 20% of the length of SD, meaning the p-type material layer 120 may extend 10% to 20% past the inner edge 142 of the source 110 toward the drain 112. In one aspect, the length of the p-type material layer 120 may extend from 20% to 30% of the length of SD, meaning the p-type material layer 120 may extend 20% to 30% past the inner edge 142 of the source 110 toward the drain 112. In one aspect, the length of the p-type material layer 120 may extend from 30% to 40% of the length of SD, meaning the p-type material layer 120 may extend 30% to 40% past the inner edge 142 of the source 110 toward the drain 112. In one aspect, the length of the p-type material layer 120 may extend from 40% to 50% of the length of SD, meaning the p-type material layer 120 may extend 40% to 50% past the inner edge 142 of the source 110 toward the drain 112. In one aspect, the length of the p-type material layer 120 may extend from 50% to 60% of the length of SD, meaning the p-type material layer 120 may extend 50% to 60% past the inner edge 142 of the source 110 toward the drain 112.

In one aspect of the present disclosure, the p+ layer 106 may not extend over the entire area of the substrate layer 102 as shown by the arrow LENGTH P+ 106 as shown in FIGS. 1-7. In this regard, the p+ layer 106 may be selectively arranged as described in detail below, the p+ layer 106 may be arranged over the entire length and selectively removed as described in detail below, the p+ layer 106 may be arranged over the entire length and selectively electrically neutralized as described in detail below, or the like. Accordingly, the specific constructions of the p+ layer 106 described below encompass any of these processes that result in the p+ layer 106 having an operating construction and arrangement as noted below. In other words, the length and/or size of the p+ layer 106 does not include a part that is partially electrically neutralized or partially etched. The length and/or size of the p+ layer 106 may depend on the application of the transistor 100, requirements for the transistor 100, and the like.

With reference to the aspects further described below, the p+ layer 106 may extend horizontally parallel to the arrow LENGTH P+ 106. Moreover, the p+ layer 106 may extend horizontally parallel to the arrow LENGTH P+ 106 to a point defined by a line that is perpendicular to the arrow LENGTH P+ 106 and extends through a component of the transistor 100 as illustrated by lines 150.

In certain aspects of the disclosure, the p+ layer 106 may extend to a point within about 0 to about 0.7 µm of the first edge 124 of the gate 114. In certain aspects of the disclosure, the p+ layer 106 may extend to a point within about 0 to about 0.5 µm of the first edge 124 of the gate 114. In certain aspects of the disclosure, the p+ layer 106 may extend to a point within about 0 to about 0.3 µm of the first edge 124 of the gate 114. In one aspect of the disclosure, the p+ layer 106 may extend laterally from at least beneath the source 110 to a position beneath a second edge 122 of the gate 114. In certain aspects of the disclosure, the p+ layer 106 may extend to a point within about 0 to about 0.7 µm of the second edge 122 of the gate 114. In certain aspects of the disclosure, the p+ layer 106 may extend to a point within about 0 to about 0.5 µm of the second edge 122 of the gate 114. In certain aspects of the disclosure, the p+ layer 106 may extend to a point within about 0 to about 0.3 µm of the second edge 122 of the gate 114.

In other aspects, a length of the p+ layer 106 LENGTH P+ 106 can also be seen in relation to positions and/or lengths of other components based on the length SD. The length SD in this case may be the length between an inner edge 142 of the source 110 toward an inner edge 144 of the drain 112 as shown in FIG. 2.

In one aspect, the length of the p+ layer 106 may extend from 10% to 20% of the length of SD, meaning the p+ layer 106 may extend 10% to 20% past the inner edge 142 of the source 110 toward the drain 112. In one aspect, the length of the p+ layer 106 may extend from 20% to 30% of the length of SD, meaning the p+ layer 106 may extend 20% to 30% past the inner edge 142 of the source 110 toward the drain 112. In one aspect, the length of the p+ layer 106 may extend from 30% to 40% of the length of SD, meaning the p+ layer 106 may extend 30% to 40% past the inner edge 142 of the source 110 toward the drain 112. In one aspect, the length of the p+ layer 106 may extend from 40% to 50% of the length of SD, meaning the p+ layer 106 may extend 40% to 50% past the inner edge 142 of the source 110 toward the drain 112. In one aspect, the length of the p+ layer 106 may extend from 50% to 60% of the length of SD, meaning the p+ layer 106 may extend 50% to 60% past the inner edge 142 of the source 110 toward the drain 112. In one aspect, the length of the p+ layer 106 may extend from 60% to 70% of the length of SD, meaning the p+ layer 106 may extend 60% to 70% past the inner edge 142 of the source 110 toward the drain 112. In one aspect, the length of the p+ layer 106 may extend from 70% to 80% of the length of SD, meaning the p+ layer 106 may extend 70% to 80% past the inner edge 142 of the source 110 toward the drain 112.

A gate contact may be provided for the gate 114 in between the source 110 and the drain 112. Furthermore, in certain aspects of the disclosure, the gate contact may be disposed on the barrier layer 108.

The gate 114 may be formed of platinum (Pt), nickel (Ni), and/or gold (Au), however, other metals known to one skilled in the art to achieve the Schottky effect, may be used. In one aspect, the gate 114 may include a Schottky gate contact that may have a three layer structure. Such a structure may have advantages because of the high adhesion of some materials. In one aspect, the gate 114 may further include an overlayer of highly conductive metal. A field plate 132 may be arranged on top of another protective layer and may be separated from the gate 114. The field plate 132 may be electrically connected to the source 110 and may also be referred to as a source connected field plate.

In another aspect, metal overlayers may be provided on one or more of the source 110 and p-type material contact 118, the drain 112 and the gate 114. The overlayers may be Au, Silver (Ag), Al, Pt and/or Copper (Cu). Other suitable highly conductive metals may also be used for the overlayer. Furthermore, the metal overlayer may electrically couple to the p-type material contact 118.

Figure 7:
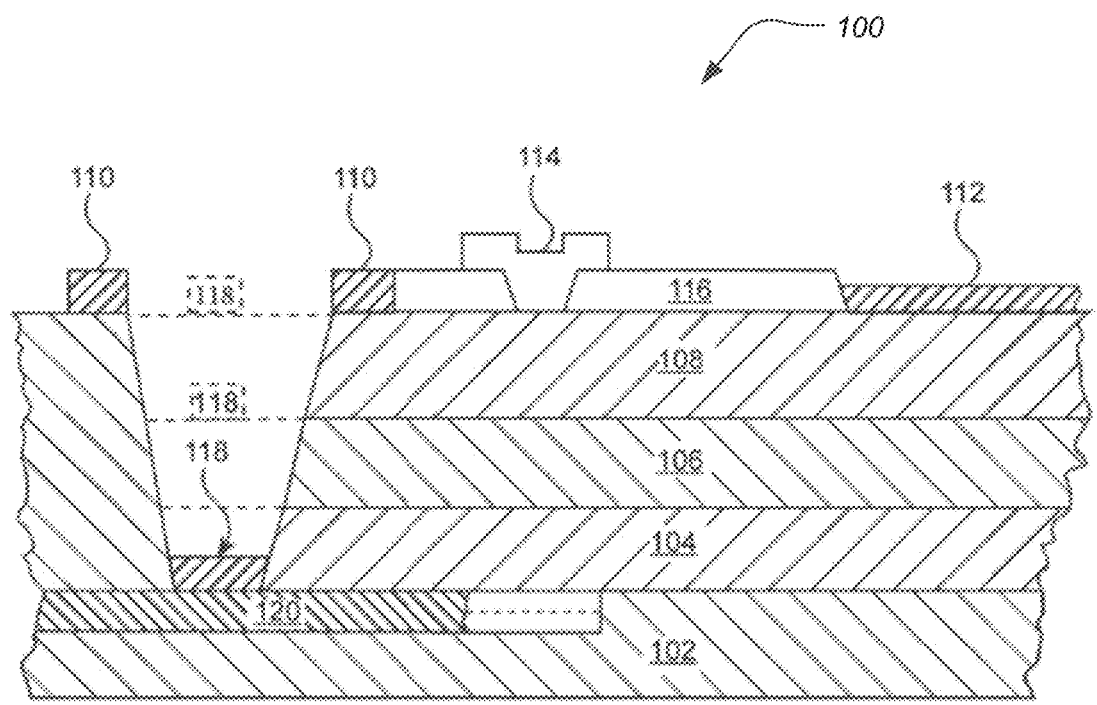
FIG. 7 shows a cross-sectional view of another aspect of a transistor according to the disclosure.

FIG. 7 shows a cross-sectional view of another aspect of a transistor according to the disclosure. In the FIG. 7 aspect, the p-type material layer 120 may be formed in or on the substrate layer 102 and the transistor 100 may include a second buffer layer 106. While FIG. 7 illustrates the transistor 100 with the first buffer layer 104 and the second buffer layer 106, the transistor 100 may also use only one buffer layer 104. In one aspect, to form the p-type material layer 120 in the substrate layer 102, Al may be implanted in the substrate layer 102 and annealed. In one aspect, the substrate layer 102 may be doped with the p-type material layer 120. In one aspect, the substrate layer 102 may be boron doped to form the p-type material layer 120. Other materials are contemplated as well including Ga. The length of the p-type material layer 120 near the surface of the p-type material layer 120 can be limited using the techniques described in other aspects above.

The second buffer layer 106 may be deposited or grown on the first buffer layer 104 on a side of the first buffer layer 104 opposite of the substrate layer 102. In one aspect, the second buffer layer 106 is formed directly on the first buffer layer 104. The second buffer layer 106 may be a high-purity material such as Gallium Nitride (GaN), AlN, or the like. In one aspect, the second buffer layer 106 may be a high-purity GaN. In one aspect, the second buffer layer 106 may be a high-purity AlN. The second buffer layer 106 may be a p-type material or n-type material. In another aspect, the second buffer layer 106 may be undoped.

Figure 8:
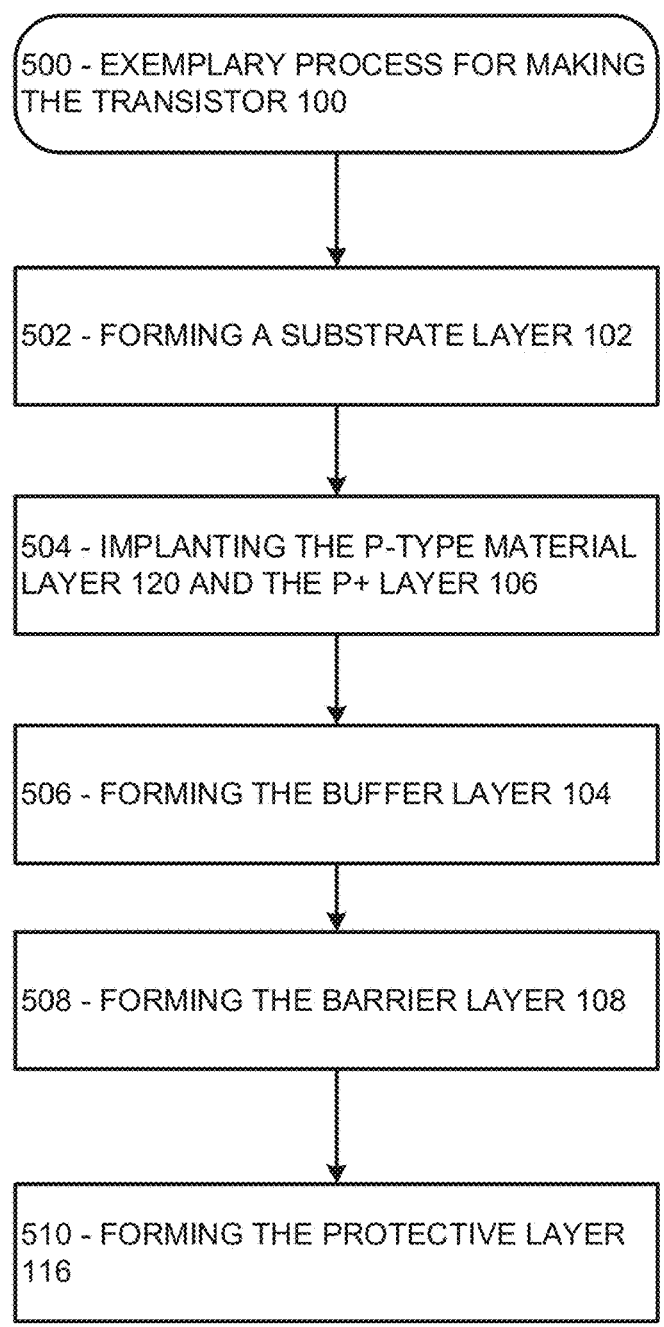
FIG. 8 shows a process for making a transistor according to the disclosure.

FIG. 8 shows a process for making a transistor according to the disclosure. In particular, FIG. 8 shows an exemplary process 500 for making the transistor 100 of FIGS. 1-7. It should be noted that the process 500 is merely exemplary and may be modified consistent with the various aspects disclosed herein.

The process 500 may begin at step 502 by forming a substrate layer 102. The substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be $1E15/cm^3$ or less. The substrate layer 102 may be formed of SiC selected from the group of 6H, 4H, 15R 3C SiC, or the like. In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials.

In some aspects, the substrate layer 102 may be made of a p-type material SiC substrate. In this aspect, the p-type material layer 120 formation by implantation of step 504 may not be necessary. Further in this aspect, the substrate layer 102 being a p-type material SiC substrate may be subsequently subjected to the processes as described herein including implantation of a p+ layer 106.

In a first aspect directed to the transistor 100 of FIG. 1 and FIG. 2, the process 500 may include a step 504 of implanting Al into the substrate layer 102 to form the p-type material layer 120 in the substrate layer 102 as shown in FIG. 1 and FIG. 2. The p-type material layer 120 may be formed by ion implantation of Al and annealing. In one aspect the p-type material layer 120 may be formed by implantation and annealing of Al prior to the growth of any GaN layers. In one aspect, the ion implementation may utilize channeling implants. In one aspect, the channeling implants may include aligning the ion beam to the substrate layer 102. Alignment of the ion beam may result in increased implantation efficiency. The process 500 may further include implanting Al into the substrate layer 102 to form the p+ layer 106 in the substrate layer 102 as shown in FIG. 1 and FIG. 2. Thereafter, the substrate layer 102 may be annealed as defined herein. In one aspect, the p-type material layer 120 may be formed by ion implantation of $^{27}Al$ in 4H—SiC implanted with channeling conditions with an implant energy of $E_1=100$ keV with a dose of $1E13$ $cm^2$ at 25° C. In one aspect, the p-type material layer 120 may be formed by ion implantation of $^{27}Al$ in 4H—SiC implanted with channeling conditions with an implant energy of $E_2=300$ keV with a dose of $1E13$ $cm^2$ at 25° C. However, other implant energies and doses are contemplated as well.

In the first aspect directed to the transistor 100 of FIG. 1 and FIG. 2, the buffer layer 104 may be formed at step 506 on the substrate layer 102. The buffer layer 104 may be grown or deposited on the substrate layer 102. In one aspect, the buffer layer 104 may be GaN. In another aspect, the buffer layer 104 may be formed with LEO.

In a second aspect directed to the transistor 100 of FIG. 3 and FIG. 4, the process 500 may include a step 504 forming the epitaxial layer 202 on the substrate layer 102. Thereafter, implanting Al into the epitaxial layer 202 to form the p-type material layer 120 in the epitaxial layer 202 as shown in FIG. 3 and FIG. 4. The process 500 may further include implanting Al into the epitaxial layer 202 to form the p+ layer 106 in the epitaxial layer 202 as shown in FIG. 3 and FIG. 4. Thereafter, the epitaxial layer 202 may be annealed as defined herein.

In the second aspect directed to the transistor 100 of FIG. 3 and FIG. 4, the buffer layer 104 may be formed at step 506 on the epitaxial layer 202. The buffer layer 104 may be grown or deposited on the epitaxial layer 202. In one aspect, the buffer layer 104 may be GaN. In another aspect, the buffer layer 104 may be formed with LEO.

At step 508, the barrier layer 108 may be formed on the buffer layer 104. The barrier layer 108 may be an n-type conductivity layer or may be undoped. In one aspect, the barrier layer 108 may be AlGaN.

At step 510, the protective layer 116 may be formed. The protective layer 116 may be a passivation layer, such as SiN, AlO, SiO, $SiO_2$, AlN, or the like, or a combination incorporating multiple layers thereof, which may be deposited over the exposed surface of the barrier layer 108. In another aspect of the disclosure, to create a place for contact with the p+ layer 106, a recess may be created by removing at least part of the barrier layer 108 and at least part of the buffer layer 104. The recess may remove any material above the p+ layer 106 within a portion of a region associated with the source 110, exposing the p+ layer 106 on a side opposite of the substrate layer 102.

Further during the process 500, the source 110 may be arranged on the barrier layer 108. The source 110 may be an ohmic contact of a suitable material that may be annealed. For example, the source 110 may be annealed at a temperature of from about 500° C. to about 800° C. for about 2 minutes. However, other times and temperatures may also be utilized. Times from about 30 seconds to about 10 minutes may be, for example, acceptable.

Further during the process 500, the drain 112 may be arranged on the barrier layer 108. Like the source 110, the drain 112 may be may be an ohmic contact of Ni or another suitable material, and may also be annealed in a similar fashion. In one aspect, an n+ implant is used through barrier layer 108 and the contacts are made to the implant.

Further during the process 500, the gate 114 may be arranged on the barrier layer 108 between the source 110 and the drain 112. A layer of Ni, Pt, AU, or the like may be formed for the gate 114 by evaporative deposition or another technique. The gate structure may then be completed by deposition of Pt and Au, or other suitable materials.

Further during the process 500 the p-type material contact 118 may be formed. Once the p+ layer 106 is exposed, nickel or another suitable material may be evaporated to deposit the p-type material contact 118. The nickel or another suitable material may be annealed to form an ohmic contact, for example. Such a deposition and annealing process may be carried out utilizing conventional techniques known to those of skill in the art. For example, an ohmic contact for the p-type material contact 118 may be annealed at a temperature of from about 600° C. to about 1050° C. Once the p-type material contact 118 has been formed on the p+ layer 106, a metal overlayer may electrically couple the p-type material contact 118 of the p+ layer 106 to the source 110. Doing this may maintain the conductivity of the p+ layer 106 and the source 110 at the same potential.

Source 110 and drain 112 electrodes may be formed making ohmic contacts such that an electric current flows between the source 110 and drain 112 electrodes via a two-dimensional electron gas (2DEG) induced at the heterointerface between the buffer layer 104 and barrier layer 108 when a gate 114 electrode is biased at an appropriate level.

The gate 114 may extend on top of a spacer or the protective layer 116. The protective layer 116 may be etched and the gate 114 deposited such that the bottom of the gate 114 is on the surface of barrier layer 108. The metal forming the gate 114 may be patterned to extend across protective layer 116 so that the top of the gate 114 forms a field plate structure 132. In one aspect, the field plate structure 132 extends toward the edge of gate 114 towards the drain 112. In one aspect, the field plate structure 132 extends towards the source 110. In one aspect, the field plate structure 132 extends towards the drain 112 and towards the source 110. In another aspect, the field plate structure 132 does not extend toward the edge of gate 114. Finally, the structure may be covered with a dielectric passivation layer 134 such as silicon nitride. The dielectric passivation layer 134 may also be implemented similar to the protective layer 116. Moreover, it should be noted that the cross-sectional shape of the gate 114, shown in FIGS. 1-6 is exemplary. For example, the cross-sectional shape of the gate 114 in some aspects may not include the T-shaped extensions. Other constructions of the gate 114 may be utilized, for example, the construction of the gate 114 illustrated in FIG. 7.

It should be noted that the steps of process 500 may be performed in a different order consistent with the aspects described above. Moreover, the process 500 may be modified consistent with the various aspects disclosed herein.

Figure 9:
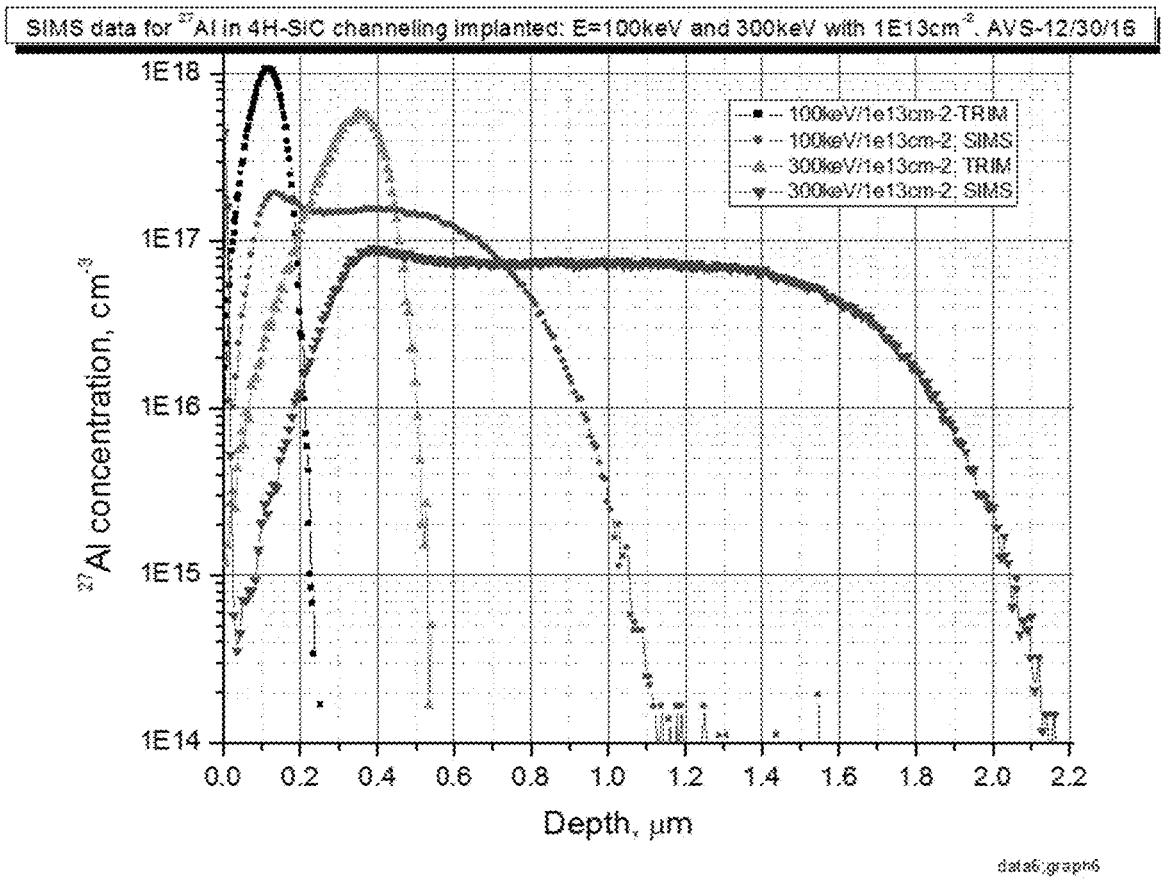
FIG. 9 illustrates a distribution of Al implanted with channeling conditions according to aspects of the disclosure in comparison to simulations for conventional implant conditions.

FIG. 9 illustrates a distribution of Al implanted with channeling conditions according to aspects of the disclosure in comparison to simulations for conventional implant conditions.

In particular FIG. 9 illustrates a distribution of $^{27}Al$ in 4H—SiC implanted with channeling conditions along C-axis (secondary ion mass spectrometry (SIMS) data) in comparison with simulations for conventional implant conditions (TRIM) off axis. The implant energy utilized was $E_1$=100 keV and $E_2$=300 keV with a dose of 1E13 $cm^{-2}$ at 25° C. In this regard, the p-type material layer 120 may be implanted consistent with this implant energy and dose. However, other implant energies and doses are contemplated as well as described herein.

In one aspect, the p-type material layer 120 may have a doping concentration less than the p+ layer 106. In one aspect, p+ layer 106 may be doped as highly as possible with minimum achievable sheet resistance. In one aspect, the p-type material layer 120 may have an implantation concentration less than the p+ layer 106. In one aspect, p+ layer 106 may have an implantation concentration as high as possible with minimum achievable sheet resistance.

In one aspect, the p-type material layer 120 doping may be less than 1E17 $cm^3$. In one aspect, the p-type material layer 120 doping may be less than 2E17 $cm^3$. In one aspect, the p-type material layer 120 doping may be less than 6E17 $cm^3$. In one aspect, the p-type material layer 120 doping may be less than 2E18 $cm^3$. In one aspect, the p-type material layer 120 doping may be in the range of 5E15 to 5E17 per $cm^3$. In these aspects, the p+ layer 106 doping concentration may be greater than a doping concentration of the p-type material layer 120.

Accordingly, the disclosure has set forth a simpler alternative solution to forming p-type layers in HEMTs. The disclosed structure can be readily fabricated with currently available techniques. Moreover, the disclosed use of a high-purity material minimizes drain lag effects. Additionally, the disclosed p-type material layer provides a retarding electric field to obtain good electron confinement with low leakage. Additionally, aspects of this disclosure have described in detail variations of transistors with p-type layers and the ways those p-type layers are formed. The disclosed transistors maximize RF power, allow for efficient discharge, and maximize breakdowns.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A high-electron mobility transistor comprising:
   a substrate layer;
   a buffer layer arranged on the substrate layer;
   a p-type material layer having a length parallel to a surface of the substrate layer over which the buffer layer is provided; and
   a p+ type material layer being arranged on the p-type material layer,
   wherein the p-type material layer is provided in one of the following locations: the substrate layer or a first layer arranged on the substrate layer;
   wherein the p+ type material layer comprises a doping concentration greater than a doping concentration of the p-type material layer; and
   wherein a thickness of the p-type material layer is greater than a thickness of the p+ type material layer.

2. The transistor of claim 1,
   wherein the p+ type material layer comprises a length parallel to the surface of the substrate layer over which the buffer layer is provided, the length of the p+ type material layer being less than an entire length of the substrate layer parallel to the surface of the substrate layer,
   wherein the p-type material layer and the p+ type material layer are provided in one of the following locations: the substrate layer or the first layer arranged on the substrate layer,
   wherein the substrate layer comprises SiC, and
   wherein the buffer layer comprises at least one of the following: GaN, AlGaN, or AlN.

3. The transistor of claim 2,
   wherein the p+ type material layer length parallel to the surface of the substrate layer extends at least from a source to at least to an edge of a gate adjacent to a drain; and
   wherein the length of the p-type material layer is less than an entire length of the substrate layer.

4. The transistor of claim 1,
   wherein the length of the p-type material layer is less than an entire length of the substrate layer parallel to the surface of the substrate layer.

5. The transistor of claim 4,
   wherein the p-type material layer length parallel to a surface of the substrate layer extends at least from a source toward an edge of a gate adjacent a drain; and
   wherein the length of the p-type material layer is greater than a length of the p+ type material layer.

6. A high-electron mobility transistor comprising:
   a substrate layer;
   a buffer layer arranged on the substrate layer;
   a p-type material layer having a length parallel to a surface of the substrate layer over which the buffer layer is provided; and
   a p+ type material layer being arranged on the p-type material layer,
   wherein the p+ type material layer comprises a doping concentration greater than a doping concentration of the p-type material layer;
   wherein the p-type material layer is provided in the substrate layer;
   wherein the p-type material layer comprises aluminum implanted in the substrate layer; and
   wherein a thickness of the p-type material layer is greater than a thickness of the p+ type material layer.

7. A high-electron mobility transistor comprising:
   a substrate layer;
   a buffer layer arranged on the substrate layer;
   a p-type material layer having a length parallel to a surface of the substrate layer over which the buffer layer is provided; and
   a p+ type material layer being arranged on the p-type material layer,
   wherein the p-type material layer is provided in one of the following locations: the substrate layer or a first layer arranged on the substrate layer; and
   wherein the p+ type material layer comprises a doping concentration greater than a doping concentration of the p-type material layer;
   wherein the p+ type material layer comprises a length parallel to the surface of the substrate layer over which the buffer layer is provided, the length of the p+ type material layer being less than an entire length of the substrate layer parallel to the surface of the substrate layer;
   wherein the p+ type material layer is provided in the substrate layer;
   wherein the p+ type material layer comprises aluminum implanted in the substrate layer; and
   wherein a thickness of the p-type material layer is greater than a thickness of the p+ type material layer.

8. The transistor of claim 1,
   wherein the p-type material layer is provided in the first layer arranged on the substrate layer;
   wherein the first layer is SiC and comprises an epitaxial layer;
   wherein the p-type material layer comprises aluminum in the epitaxial layer; and
   wherein the p+ type material layer comprises a length parallel to a surface of the substrate layer over which the buffer layer is provided, the length of the p+ type material layer being less than an entire length of the substrate layer parallel to the surface of the substrate layer.

9. The transistor of claim 6,
   wherein the p-type material layer is provided in the substrate layer;
   wherein the p-type material layer is configured to have a depth greater than 0.5 µm;
   wherein the p+ type material layer comprises a length parallel to a surface of the substrate layer over which the buffer layer is provided, the length of the p+ type material layer being less than an entire length of the substrate layer parallel to the surface of the substrate layer;
   wherein the substrate layer comprises SiC; and
   wherein the buffer layer comprises at least one of the following: GaN, AlGaN, or AlN.

10. The transistor of claim 7,
wherein the p-type material layer extends over the entire length of one of the following: the substrate layer and the first layer arranged on the substrate layer;
wherein the p+ type material layer comprises a length parallel to a surface of the substrate layer over which the buffer layer is provided, the length of the p+ type material layer being less than an entire length of the substrate layer parallel to the surface of the substrate layer;
wherein the substrate layer comprises SiC; and
wherein the buffer layer comprises at least one of the following: GaN, AlGaN, or AlN.

11. A method of making a high-electron mobility transistor comprising:
providing a substrate layer;
providing a buffer layer on the substrate layer;
providing a p-type material layer having a length parallel to a surface of the substrate layer over which the buffer layer is provided;
providing a p+ type material layer on the p-type material layer; and
providing the p-type material layer in one of the following locations: the substrate layer or a first layer arranged on the substrate layer,
wherein the p+ type material layer comprises a doping concentration greater than a doping concentration of the p-type material layer,
wherein a thickness of the p-type material layer is greater than a thickness of the p+ type material layer.

12. The method of claim 11, further comprising:
providing the p+ type material layer further comprises providing the p+ type material layer having a length parallel to a surface of the substrate layer over which the buffer layer is provided such that the length of the p+ type material layer is less than an entire length of the substrate layer parallel to the surface of the substrate layer;
providing the p-type material layer and the p+ type material layer in one of the following locations: the substrate layer or the first layer arranged on the substrate layer; and
the providing the p-type material layer having a length parallel to a surface of the substrate layer over which the buffer layer further comprises implanting the p-type material layer utilizing channeling conditions.

13. The method of claim 12,
wherein the p+ type material layer length parallel to the surface of the substrate layer extends at least from a source to at least to an edge of a gate adjacent to the drain.

14. A method of making a high-electron mobility transistor comprising:
providing a substrate layer;
providing a buffer layer on the substrate layer;
providing a p-type material layer having a length parallel to a surface of the substrate layer over which the buffer layer is provided; and
providing a p+ type material layer on the p-type material layer,
wherein the p+ type material layer comprises a doping concentration greater than a doping concentration of the p-type material layer;
wherein the p-type material layer is provided in the substrate layer;
wherein the p-type material layer comprises aluminum implanted in the substrate layer;
wherein the p+ type material layer is provided in the substrate layer;
wherein the p+ type material layer comprises aluminum implanted in the substrate layer; and
wherein a thickness of the p-type material layer is greater than a thickness of the p+ type material layer.

15. The method of claim 14,
wherein the length of the p-type material layer is less than an entire length of the substrate layer parallel to the surface of the substrate layer;
wherein the substrate layer comprises SiC; and
wherein the buffer layer comprises at least one of the following: GaN, AlGaN, or AlN.

16. The method of claim 15,
wherein the p-type material layer length parallel to a surface of the substrate layer extends at least from a source toward an edge of a gate adjacent the drain; and
wherein the length of the p-type material layer parallel to a surface of the substrate layer is greater than a length of the p+ type material layer.

17. The method of claim 12,
wherein the p-type material layer is provided in the substrate layer;
wherein the p-type material layer is configured to have a depth greater than 0.5 μm; and
wherein the length of the p-type material layer is greater than a length of the p+ type material layer.

18. A high-electron mobility transistor comprising:
a substrate layer;
a buffer layer arranged on the substrate layer;
a p-type material layer having a length parallel to a surface of the substrate layer over which the buffer layer is provided; and
a p+ type material layer having a length parallel to a surface of the substrate layer over which the buffer layer is provided, the length of the p+ type material layer being less than an entire length of the substrate layer, and the p+ type material layer being arranged in the p-type material layer,
wherein the p-type material layer and the p+ type material layer are provided in one of the following locations: the substrate layer or a first layer arranged on the substrate layer;
wherein the p+ type material layer comprises a doping concentration greater than a doping concentration of the p-type material layer;
wherein the length of the p-type material layer is less than an entire length of the substrate layer; and
wherein the p-type material layer is configured to have a depth greater than a depth of the p+ type material layer.

19. The transistor of claim 18,
wherein the p+ type material length parallel to the surface of the substrate layer extends at least from a source to at least to an edge of a gate adjacent to drain; and
wherein the length of the p-type material layer is greater than a length of the p+ type material layer.

20. The transistor of claim 18,
wherein the p-type material layer is provided in the substrate layer;
wherein the p-type material comprises aluminum implanted in the substrate layer;
wherein the p+ type material layer is provided in the substrate layer;

wherein the p+ type material layer comprises aluminum implanted in the substrate layer; and wherein the length of the p-type material layer is greater than a length of the p+ type material layer.

* * * * *